(12) United States Patent
Bhoja et al.

(10) Patent No.: US 7,924,910 B2
(45) Date of Patent: Apr. 12, 2011

(54) ADAPTIVE EQUALIZATION WITH GROUP DELAY

(75) Inventors: Sudeep Bhoja, San Jose, CA (US); John S. Wang, Sunnyvale, CA (US); Hai Tao, Sunnyvale, CA (US)

(73) Assignee: Vitesse Semiconductor Corporation, Camarillo, CA (US)

( * ) Notice: Subject to any disclaimer, the term of this patent is extended or adjusted under 35 U.S.C. 154(b) by 1446 days.

(21) Appl. No.: 11/029,297

(22) Filed: Jan. 4, 2005

(65) Prior Publication Data

US 2006/0146926 A1 Jul. 6, 2006

(51) Int. Cl.
 *H03H 7/30* (2006.01)
(52) U.S. Cl. ........ 375/233; 375/232; 375/234; 375/371; 375/376; 375/224; 398/208; 398/209; 398/149; 398/161
(58) Field of Classification Search .......... 375/232–234, 375/224, 348, 371, 376; 398/208, 209, 149, 398/161, 102, 29; 333/18; 379/406.08, 406.09; 327/147, 158, 161, 236, 532
See application file for complete search history.

(56) References Cited

U.S. PATENT DOCUMENTS

| | | | | |
|---|---|---|---|---|
| 4,539,690 | A * | 9/1985 | Speidel | 375/232 |
| 5,802,118 | A * | 9/1998 | Bliss et al. | 375/350 |
| 6,178,201 | B1 * | 1/2001 | Hillery | 375/232 |
| 6,208,481 | B1 | 3/2001 | Spurbeck et al. | |
| 7,050,918 | B2 * | 5/2006 | Pupalaikis et al. | 702/106 |
| 2003/0011847 | A1 * | 1/2003 | Dai et al. | 359/161 |
| 2003/0048840 | A1 * | 3/2003 | Ling et al. | 375/232 |
| 2004/0091036 | A1 * | 5/2004 | Balasubramonian et al. | 375/232 |
| 2005/0135475 | A1 * | 6/2005 | Momtaz et al. | 375/240 |

OTHER PUBLICATIONS

Richard johnson et al.; convergence of an adaptive filter with signed filtered error; IEEE transactions on signal processing, vol. 42 No. 4 Apr. 1994, pp. 946-950.*
D.A. Johns et al., "Orthonormal Ladder Filters," IEEE Transactions on Circuits and Systems, vol. 36, No. 3, pp. 337-343 (Mar. 1989).
H. Wu et al., "Integrated Transversal Equalizers in High-Speed Fiber-Optic Systems," IEEE Journal of Solid-State Circuits, vol. 38, No. 12 (Dec. 2003).

* cited by examiner

*Primary Examiner* — David C Payne
*Assistant Examiner* — Rahel Guarino
(74) *Attorney, Agent, or Firm* — Klein, O'Neill & Singh, LLP

(57) ABSTRACT

Methods, apparatuses, and systems are presented for performing adaptive equalization involving receiving a signal originating from a channel associated with inter-symbol interference, filtering the signal using a filter having a plurality of adjustable tap weights to produce a filtered signal, and adaptively updating each of the plurality of adjustable tap weights to a new value to reduce effects of inter-symbol interference, wherein each of the plurality of adjustable tap weights is adaptively updated to take into account a constraint relating to a measure of error in the filtered signal and a constraint relating to group delay associated with the filter. Each of the plurality of adjustable tap weights may be adaptively updated to drive group delay associated with the filter toward a target group delay.

11 Claims, 8 Drawing Sheets

ADAPTIVE EQUALIZATION WITH GROUP DELAY

CROSS-REFERENCES TO RELATED APPLICATIONS

This application is related to U.S. patent application Ser. No. 10/872,108, filed Jun. 17, 2004 by Shanthi Pavan for "Power and Area Efficient Adaptive Equalization", the entire disclosure of which is incorporated by reference in this application for all purposes.

This application is also related to U.S. patent application Ser. No. 10/872,307, filed Jun. 17, 2004 by Shanthi Pavan for "Improved Integrated Circuit Implementation for Power and Area Efficient Adaptive Equalization", the entire disclosure of which is incorporated by reference in this application for all purposes.

BACKGROUND OF THE INVENTION

Increased demand for high-speed communications services has required that economical and efficient new devices and techniques be developed to support performance increases. For example, as transmission rates climb to the 10-40 Gbps range and beyond in modern optical networks, signal processing and conditioning techniques must be applied to filter out noise and reduce interference such as inter-symbol interference (ISI). Typical optical networks are plagued by noise and bandwidth limitations caused by polarization mode dispersion, modal dispersion, chromatic dispersion, limited component bandwidth, and/or other undesired phenomena. Such effects often cause problems such as group delay distortion, frequency-related attenuation, and/or others. Furthermore, ISI can be time varying due to a variety of causes, such as physical vibration, mechanical stresses, and temperature fluctuations. Typically, optical receivers may use devices such as equalizers to improve the overall performance of such systems and minimize the error rate. However, the implementation of such devices has proven to be challenging and costly.

One particularly difficult problem in the design of optical receivers relates to mutual interference that may exist between an adaptive equalizer and other circuit(s). FIG. 1 is a block diagram of a typical optical receiver 100 capable of receiving signals from an optical communication channel. As shown in the figure, receiver 100 includes a photo diode 102, an adaptive equalizer 104, and a clock recovery circuit 106. Generally speaking, an optical signal is received at optical diode 102, which converts the optical signal into an electrical signal. The electrical signal is provided to adaptive equalizer 104. Adaptive equalizer 104 performs adaptive equalization on the electrical signal to reduce effects of ISI and outputs an equalized signal. Adaptive equalizer interacts with clock recovery circuit 106, which operates to provide symbol timing information to adaptive equalizer 104. Thus, one or more signals may be sent between adaptive equalizer 104 and clock recovery circuit 106. As optical receiver 100 operates, mutual interference may occur between components of adaptive equalizer 104 and components of clock recovery circuit 106. Such interference can be associated with instability affecting one or more components of optical receiver 100 and can lead to dramatic performance degradations.

FIG. 2 is a block diagram of a portion of a receiver containing an adaptive equalizer coupled to a clock recovery circuit that minimizes mean squared error (MMSE). This clock recovery technique allows recovery of timing information from a signal associated with a closed or nearly closed eye diagram, such as that of a signal emerging from a multi-mode optical fiber channel. As shown in FIG. 2, the adaptive equalizer and clock recovery circuit together comprise a feed-forward filter 202 and a feed-back filter 204, a slicer 206, a slope estimator 208, a low-pass filter 210, and a voltage-controlled oscillator (VCO) 212.

The adaptive equalizer illustrated in FIG. 2 is a decision-feedback equalizer (DFE) that utilizes both feed-forward filter 202 and feed-back filter 204, as well as slicer 206. Feed-forward filter 202 may be a linear transversal filter having taps spaced at a fractional symbol interval T/2. The received signal is provided as input to feed-forward filter 202. For example, the received signal may be the electric signal outputted by photo diode 102 in FIG. 1. Feed-forward filter 202 operates to reduce inter-symbol interference caused by yet-to-be detected symbols, producing a first equalized signal. This first equalized signal is summed with a feedback signal that is the output of feed-back filter 204, to produce a second equalized signal. The first equalized signal is shown as being first sampled at a rate of 2/T, then down-sampled at a rate of 1/T. Timing for this sampling is provided by the clock recovery circuit, described in further detail below. The second equalized signal is provided to slicer 206, which performs a threshold function on the second equalized signal to produce a signal representing detected symbol decisions. The symbol decisions are provided as input to feed-back filter 204. By providing a feedback signal, based on detected symbols, that may be added to the first equalized signal, feed-back filter 204 operates to reduce inter-symbol interference caused by previously detected symbols. The equalizer shown in FIG. 2 is adaptive in the sense that coefficients, or taps, of the feed-forward filter 202 and/or feed-back filter 204 are automatically adjusted to optimize one or more performance measures, such as an error measure. Such adaptation allows the receiver to reduce effects of inter-symbol interference, even when channel conditions are time-varying.

The clock recovery circuit utilizes slope estimator 208, low-pass filter 210, VCO 212, and slicer 206. Slope estimator 208 receives the 2/T sampled version of the first equalized signal produced by the feed-forward filter 202. A slope estimate signal produced by slope estimator 208 is multiplied with an error signal representing the difference between the input of slicer 206 and the output of slicer 206. The resulting signal from this multiply operation is provided to low-pass filter 210. The output of low-pass filter 210 is then used as input to control VCO 212. The output of VCO 212 is used to drive the timing of the sampling operation performed on the first equalized signal. Thus, slope estimator 208, low-pass filter 210, and VCO 212 form parts of a phase lock loop (PLL) that recovers symbol timing for the receiver. This circuit operates by minimizing the mean-squared-error signal representing the difference between the input of slicer 206 and the output of slicer 206. While not explicitly illustrated in the figure, the clock recovery circuit may generate timing signals that are multiples or fractions of the estimated symbol rate. For example, timing signals at twice the symbol rate, one-half the symbol rate, and/or other variations based on the symbol rate, may be generated.

The arrangement shown in FIG. 2 has an advantage over conventional clock recovery circuits that rely on edge information, which can be completely smeared by some severe optical channels, making it difficult to estimate the average zero crossing of the channel output. This arrangement also has an advantage over other well-known clock recovery approaches that involve extracting tones at half the symbol rate and passing such tones through a non-linearity to extract symbol clock information, which may not be applicable to all multimode optical fiber channels due to the possible presence of deep spectral notches at half the symbol rate on particular channels.

Despite these and other desirable properties, the arrangement shown in FIG. 2 is prone to interference that may exist between portions of the adaptive equalizer and portions of the clock recovery circuit. For example, at the same time that taps of feed-forward filter 202 and/or feed-back filter 204 are automatically adjusted to reduce effects of inter-symbol interference, the phase lock loop involving VCO 212 is actively tuning to track the symbol timing. Such dynamic operations interfere with one another, and this mutual interference may cause instability in one, some, or all of the operations involved.

The arrangement in FIG. 2 illustrates interference between an adaptive equalizer and a closely coupled clock recovery circuit. However, the problem of mutual interference is not confined to this specific example. There may be many scenarios in which interference may develop between parts of an adaptive equalizer and one or more other circuits. The effects of such mutual interference may range from minor performance degradations to complete failure of a receiver, as an unstable system. Thus, there is a significant need for effective techniques to reduce mutual interference between an adaptive equalizer and other circuits.

BRIEF SUMMARY OF THE INVENTION

The present invention relates to methods, apparatuses, and systems for performing adaptive equalization involving receiving a signal originating from a channel associated with inter-symbol interference, filtering the received signal using a filter having a plurality of adjustable tap weights to produce a filtered signal, and adaptively updating each of the plurality of adjustable tap weights to a new value to reduce effects of inter-symbol interference, wherein each of the plurality of adjustable tap weights is adaptively updated to take into account a constraint relating to a measure of error in the filtered signal and a constraint relating to group delay associated with the filter.

Each of the plurality of adjustable tap weights may be adaptively updated to drive group delay associated with the filter toward a target group delay. Each of the plurality of adjustable tap weights may also be adaptively updated to reduce a squared difference between group delay associated with the filter and the target group delay. The constraint relating to group delay associated with the filter may be based on a current value for each of the plurality of adjustable tap weights. The constraint relating to the measure of error in the filtered signal may be scaled by a first scaling factor, and the constraint relating to group delay associated with the filter may be scaled by a second scaling factor. The filter may be a feed-forward transversal filter. The filter may also be a feed-back transversal filter.

According to one embodiment of the invention, the filter is part of an adaptive equalizer, the adaptive equalizer is coupled to a clock recovery phase lock loop, and group delay associated with the filter reduces undesired interaction between the equalizer and the clock recovery phase lock loop. In one embodiment, the filter is part of an adaptive equalizer, and the adaptive equalizer is a decision-feedback equalizer (DFE). Further, in one embodiment, each of the plurality of adjustable tap weights is adaptively updated to take into account the constraint relating to the measure of error in the filtered signal, based on a least-mean-square (LMS) algorithm.

DETAILED DESCRIPTION OF THE INVENTION

Figure 1:
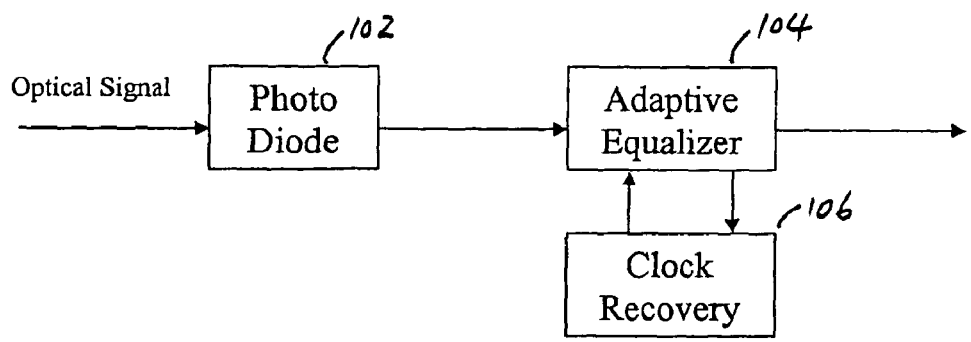
FIG. 1 is a block diagram of a typical optical receiver capable of receiving signals from an optical communication channel.
Figure 2:
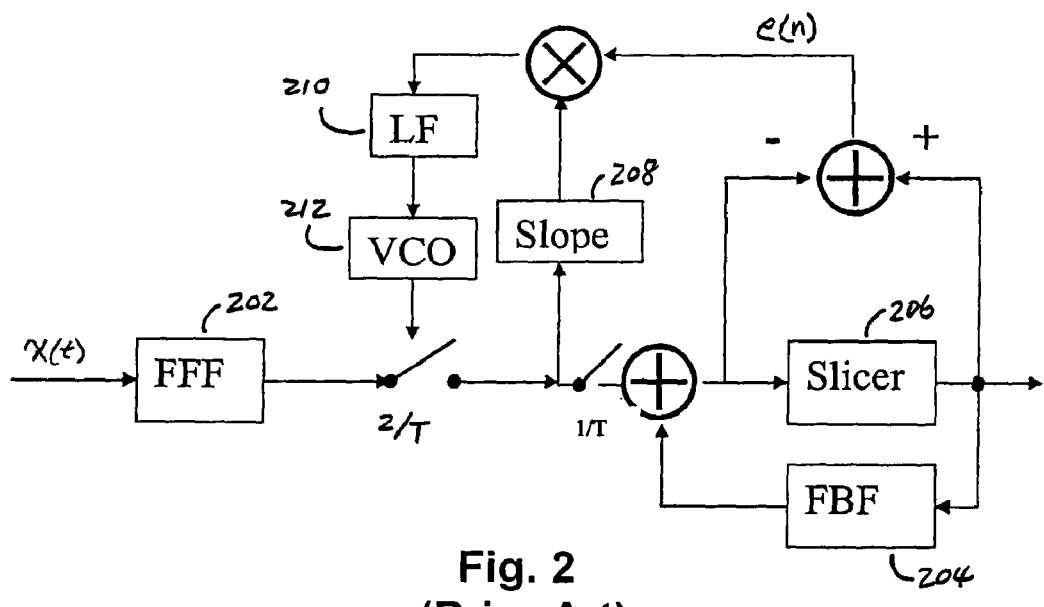
FIG. 2 is a block diagram of a portion of a receiver containing an adaptive equalizer coupled to a clock recovery circuit that minimizes mean square error (MMSE)
Figure 3:
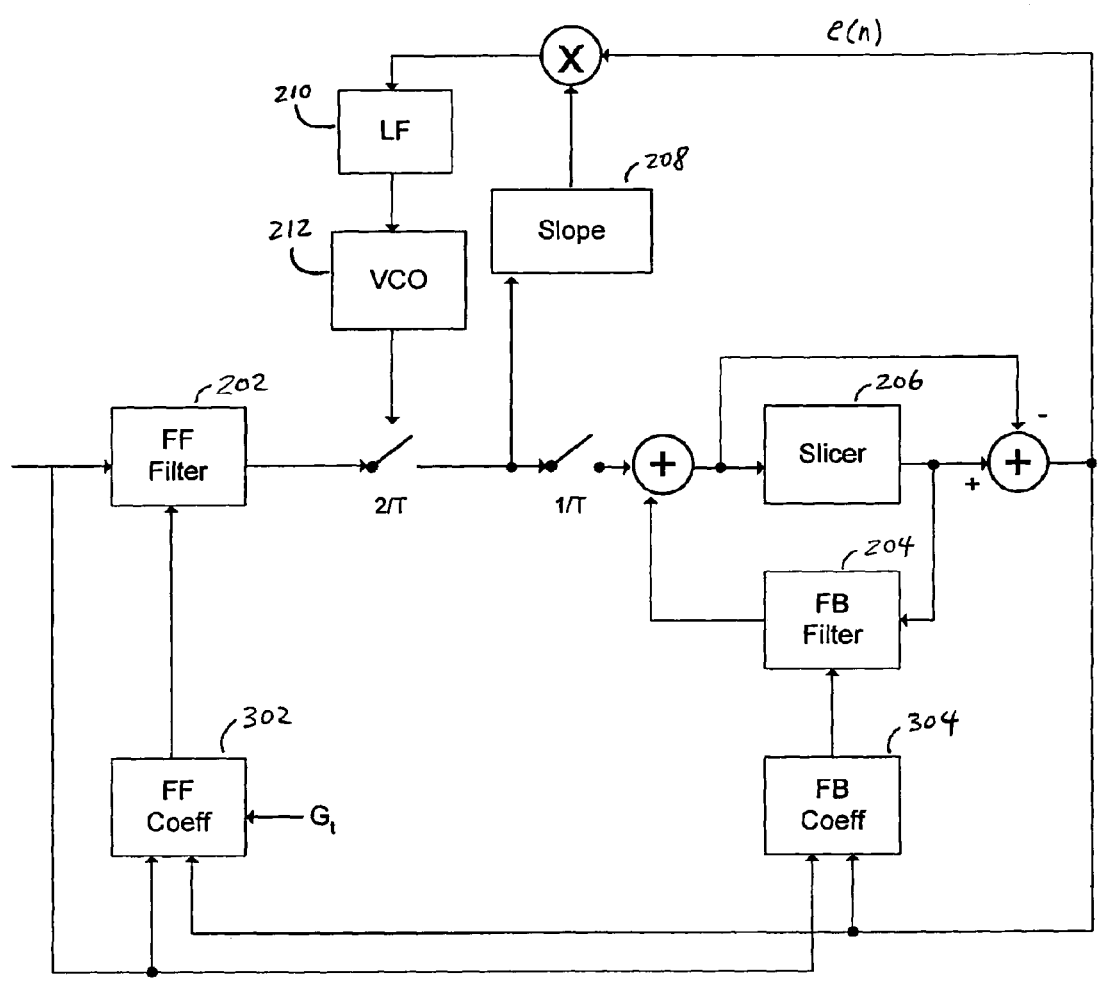
FIG. 3 is a block diagram of a portion of a receiver containing an adaptive equalizer coupled to a clock recovery circuit that minimizes mean square error (MMSE), wherein the adaptive equalizer takes into account filter group delay to reduce mutual interference with the clock recovery circuit, in accordance with one embodiment of the present invention.

FIG. 3 is a block diagram of a portion of a receiver containing an adaptive equalizer coupled to a clock recovery circuit that minimizes mean square error (MMSE), wherein the adaptive equalizer takes into account filter group delay to reduce mutual interference with the clock recovery circuit, in accordance with one embodiment of the present invention. As previously illustrated in FIG. 2, the adaptive equalizer is a decision-feedback equalizer (DFE) that utilizes both feed-forward filter 202 and feed-back filter 204, as well as slicer 206. The clock recovery circuit utilizes slope estimator 208, low-pass filter 210, VCO 212, and slicer 206. A feed-forward coefficient unit 302 automatically adjusts the coefficients, or taps, of feed-forward filter 202 in order to optimize one or more performance measures. Here, feed-forward coefficient unit 302 updates the coefficients of feed-forward filter 202 using an approach based on the least-mean-square (LMS) algorithm. Thus, for each tap of feed-forward filter 202, feed-forward coefficient unit 302 generates the next filter coefficient value by taking into account the current coefficient value (not shown in FIG. 3), the received signal x(t), and a measure of error e(n) of the current equalized signal. The received signal may be implemented as either a continuous-time signal x(t) or a discrete-time signal x(n). For simplicity of discussion, the discrete-time form x(n) is used below to describe updating of filter coefficients in adaptive equalization. A conventional LMS tap update equation for a feed-forward filter with N taps may be represented by:

$$C_{n+1}(k) = C_n(k) + \mu \cdot e(n) \cdot x(n-k) \quad k=0, \ldots, N-1 \quad (1)$$

In Equation (1), $C_{n+1}(k)$ is the next (updated) filter coefficient value, or tap value, for the $k^{th}$ tap of the feed-forward filter, $C_n(k)$ is the current filter coefficient value, or tap value, for the $k^{th}$ tap of the feed-forward filter, μ is a scaling factor that controls the speed of adaptation of the feed-forward filter coefficients, e(n) is the measure of the error of the current equalized signal, and x(n) is the received signal before equalization.

According to the present embodiment of the invention, feed-forward coefficient unit 302 also takes into account a target group delay $G_t$ in generating the next filter coefficient. That is, feed-forward coefficient unit 302 updates each of the tap values of the feed-forward filter 202 by taking into account not only a constraint relating to a measure of error in the filtered signal, but also a constraint relating to group delay associated with the feed-forward filter. This allows updating of the filter coefficients to take into account the effect that the filter coefficients have on the group delay of the filter. Thus, a tap update equation for a feed-forward filter with N taps according to the present embodiment of the invention may be represented by:

$$C_{n+1}(k) = C_n(k) + \mu \cdot e(n) \cdot x(n-k) - \alpha \cdot \frac{d}{dC_n(k)}(G_d(C_n) - G_t)^2 \quad (2)$$

Equation (2) is similar to Equation (1). However, a new group delay constraint has been added to reflect the group delay of the feed-forward filter. A scaling factor α controls the weighting, or speed of adaptation, of this new constraint. Here, $G_d(C_n)$ refers to the group delay of the feed-forward filter, expressed in terms of the tap values $C_n$ of the feed-forward filter. For example, if N=10, the vector $C_n$ represents the ten tap values $[C_n(0)\ C_n(1)\ \ldots\ C_n(N-1)]$ of the feed-forward filter. Thus, the new constraint reflects the gradient of the squared error between the current group delay associated with the feed-forward filter and a target group delay value $G_t$. The new constraint allows the N taps of the feed-forward filter to be adjusted to not only reduce effects of inter-symbol interference, but also to drive the group delay associated with the feed-forward filter toward the target group delay $G_t$. According to the present embodiment of the invention, $G_t$ is a constant value chosen to reduce mutual interference between feed-forward filter 302 and other circuits, such as the clock recovery circuit comprising VCO 212, low-pass filter 210, and slope estimator 208. A broad range of values may be chosen for $G_t$. Just as an example, $G_t$ may be chosen as a constant delay value of around six to eight delay taps, for a ten tap feed-forward filter. However, the chosen value of $G_t$ may depend on a variety of different considerations. For example, if filter coefficient values are heavily weighted around a particular filter tap (e.g., tap 0), then $G_t$ may be chosen as a delay value closer to that tap (e.g., $G_t$=0). In alternative embodiments, $G_t$ is not restricted to be a constant value. For example, $G_t$ may be dynamically adjusted in response to different environmental conditions.

There may also be other constraints added to Equation (2). For example, a tap leakage constraint, weighted by its own scaling factor β, may be added. A weighted tap leakage constraint may be:

$$\beta \cdot \frac{d}{dC_n(k)}\left(\sum_{k=0}^{N} C_n^2(k)\right).$$

It is well known that when the taps of a T/2 spaced FFE is updated with a LMS algorithm, the taps may be subject to random coefficient drift with no change in the mean square error. Hence, even a small bias in the gradient used for updating the taps may be sufficient to saturate the taps. Use of a tap leakage constraint may be effective in combating such bias.

Further, the update of coefficient values for feed-forward filter 202 need not follow Equation (2) strictly. In different embodiments, derivations and/or variations of this tap update equation may be used. For example, according to one embodiment of the invention, Equation (2) may be simplified by adopting an expression for $G_d(C_n)$ at the zero (DC) frequency:

$$G_d(C_n) = \frac{\sum_{k=0}^{N-1} k \cdot C_n(k)}{\sum_{k=0}^{N-1} C_n(k)} \quad (3)$$

Although feed-forward filter 202 may be operated at frequencies other than DC, this simplification may lead to reductions in the complexity of calculations for coefficient updates, while providing sufficient control over the group delay associated with feed-forward filter 202 to reduce effects of undesired mutual interference. Substituting Equation (3) into Equation (2) and analytically evaluating the derivative of the squared term shown in Equation (2) yields:

$$C_{n+1}(k) = C_n(k) + \mu \cdot e(n) \cdot x(n-k) - \alpha \cdot (G_d(C_n) - G_t) \cdot \frac{(k - G_d(C_n))}{\sum_{m=0}^{N-1} C_n(m)} \quad (4)$$

Here, evaluating the derivative of the squared term produces a constant multiplier value of "2." In Equation (4), this constant multiplier value is subsumed in the scaling factor α. In other words, Equation (4) simply shows "α" instead of "2α" as the scaling factor. To avoid the division operation shown in Equation (4), an alternative form of Equation (2) may be obtained as:

$$C_{n+1}(k) = \quad (5)$$
$$C_n(k) + \mu \cdot e(n) \cdot x(n-k) - \alpha \cdot \frac{d}{dC_n(k)}\left(\sum_{m=0}^{N-1} m \cdot C_n(m) - G_t \sum_{m=0}^{N-1} C_n(m)\right)^2$$

By taking the derivative, and again subsuming a constant multiplier value of "2" within the scaling factor α, Equation (5) may be rewritten in the following format:

$$C_{n+1}(k) = \quad (6)$$
$$C_n(k) + \mu \cdot e(n) \cdot x(n-k) - \alpha \cdot \left(\sum_{m=0}^{N-1} m \cdot C_n(m) - G_t \sum_{m=0}^{N-1} C_n(m)\right)(k - G_t)$$

Here, the scaling factors μ and α together determine the speed of adaptation of the feed-forward filter 202 coefficients, while also controlling the relative weight given to the group delay constraint.

According to one embodiment of the invention, $G_t$ is chosen as a constant value, and feed-forward filter 202 is implemented as a T/2 fractionally spaced linear filter. This fractionally spaced filter arrangement allows minimum performance variation of the equalizer to be achieved in connection with a fixed group delay constraint. It is well known that a baud spaced equalizer can show performance degradation to deviations from an optimal sampling phase associated with an unknown channel. This is because a symbol spaced filter cannot perform matched filtering of the channel, since it can only synthesize frequencies up to 1/(2T). However, a fractional spaced filter does not have this limitation and thus is capable of better performance.

Furthermore, when a phase detection is used in conjunction with such a fractionally spaced filter, the T/2 spaced outputs of the filter may be used to estimate slope more accurately. In FIG. 3, the multiplication of e(n) with the output of slope estimator 208 may represent such phase detection.

A group delay constraint may also be applicable in the adaptive update of filter coefficients for feed-back filter 204. Just as feed-forward coefficient unit 302 may update feed-forward filter coefficients to take into account a constraint relating to group delay of the feed-forward filter 202, feed-backward coefficient unit 304 may update feed-backward filter coefficients to take into account a constraint relating group delay of the feed-backward filter 204. Thus, feed-forward coefficient unit 302 may drive the group delay associated with the feed-forward filter 202 toward a first target group delay (shown as $G_t$ in FIG. 3), while feed-backward coefficient unit 304 may drive the group delay associated with the feed-backward filter 204 toward a second target group delay (not shown in FIG. 3). In one implementation, the first target group delay may be equal to the second target group delay. In other implementations, the first and second target group delays may have different values.

While feed-forward filter 202 and feed-forward coefficient unit 302 are shown in FIG. 3 as separate components, they may be implemented separately or together as one unit. Further, either feed-forward filter 202, feed-forward coefficient unit 302, or both, may be implemented in hardware, software, or a combination of hardware and software. For example, feed-forward filter 202 and feed-forward coefficient unit 302 may be implemented entirely in hardware, such as on an integrated circuit (IC). As another example, feed-forward filter 202 and feed-forward coefficient unit 302 may be implemented entirely in firmware controlling a digital signal processor (DSP) unit. As yet another example, feed-forward filter 202 may be implemented in hardware, and feed-forward coefficient unit 302 may be implemented in software to supply the appropriate filter coefficients to feed-forward filter 202. Similarly, feed-back filter 204 and feed-back coefficient unit 304 may be implemented separately or together as one unit. Also, feed-back filter 204 and feed-back coefficient unit 304 may be implemented in hardware, software, or a combination of hardware and software.

Figure 4:
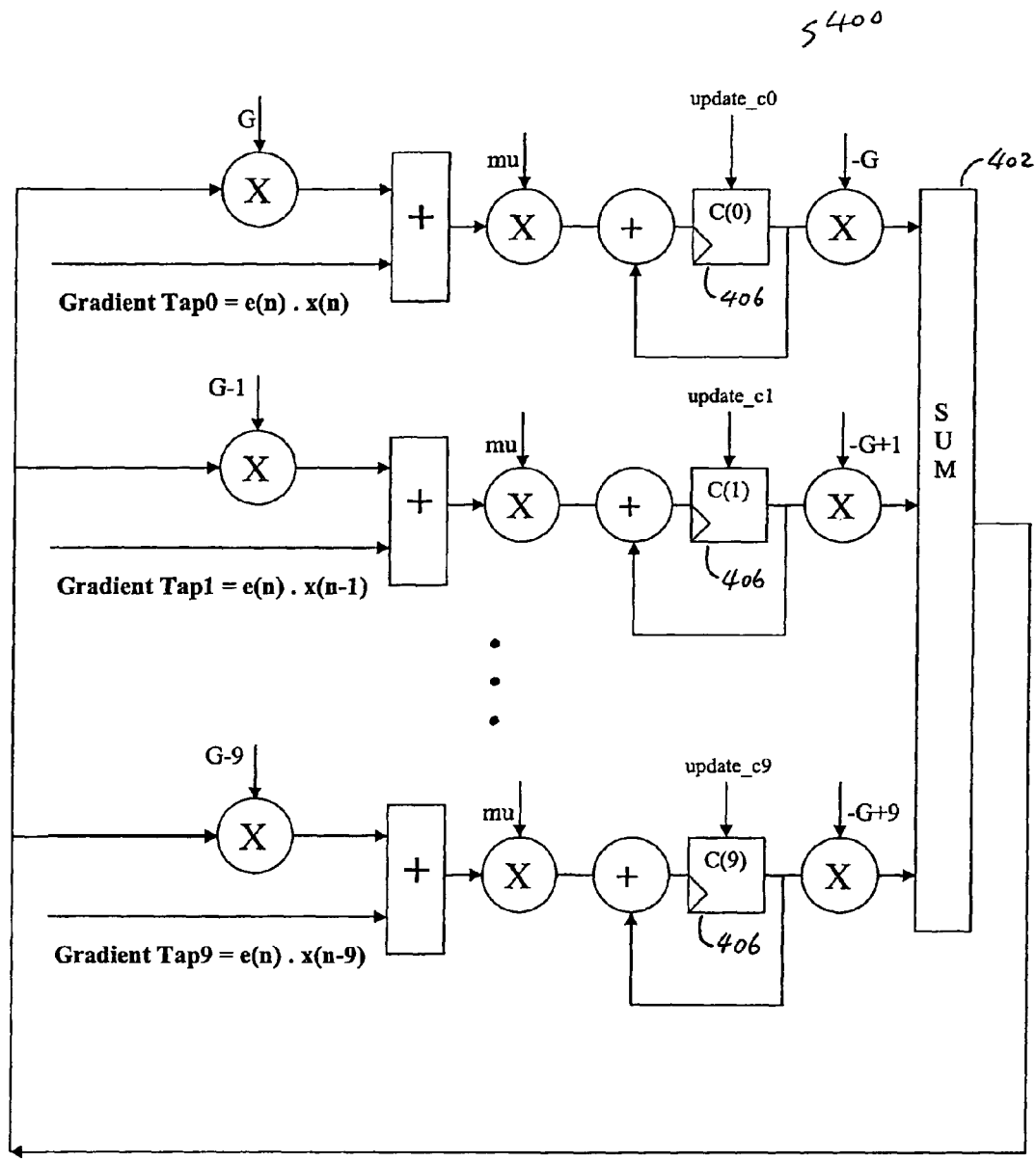
FIG. 4 is a more detailed diagram of a circuit that may be part of a feed-forward coefficient unit 302 for a ten-tap filter (N=10), in accordance with one embodiment of the invention.

FIG. 4 is a more detailed diagram of a circuit 400 that may be part of feed-forward coefficient unit 302 for a ten-tap filter (N=10), in accordance with one embodiment of the invention. Circuit 400 updates the ten filter coefficients of the ten-tap filter, based on Equation (6). As shown, circuit 400 comprises a summer 402, and ten rows of update logic (one row for each filter tap), each row providing its output to summer 402. For clarity of illustration, FIG. 4 only shows three of the ten rows of update logic, corresponding to filter coefficients k=0, k=1, and k=9. However, the other seven rows of update logic, corresponding to filter coefficients k=2 through k=8, are understood to exist as part of circuit 400. As shown in the figure, each row of update logic comprises a register 406 for storing a current value of the respective coefficient $C_n(k)$. This current value of the coefficient $C_n(k)$ is multiplied by $(k-G_t)$, and the resulting product is provided to summer 402.

As shown, circuit 400 may be adopted for a sequential implementation, or alternatively, in a parallel implementation. In a sequential implementation of circuit 400, each register 406 is updated sequentially with the appropriate C(x) value. Hence, only one register is enabled at any given time. As such, each of the ten rows of update logic is sequentially operated to produce a corresponding product to summer 402. Summer 402 adds the ten products from the ten rows of update logic to produce a summation result reflecting the expression $$\left(\sum_{m=0}^{N-1} m \cdot C_n(m) - G_t \sum_{m=0}^{N-1} C_n(m)\right) \quad (7)$$

in equation (6). This summation result is fed back to each of ten rows of update logic. A switch (not shown) may be used to apply the summation result to each row of update logic. As each row of update logic is operated, the summation result is multiplied by $(G_t-k)$ to obtain a first intermediate result. At the same time, a gradient value of $e(n) \cdot x(n-k)$ is provided as a second intermediate result. Here, the first intermediate result corresponds to a constraint related to group delay, and the second intermediate result corresponds to a constraint related to a measure of error in the filtered signal. While equation (6) is shown as applying separate scaling factors μ and α to the constraint relating to measured error and the constraint relating to group delay, respectively, a simplification is made in circuit 400 by assuming that the two scaling factors are equal and can each be represented as μ. Thus, the first intermediate result and the second intermediate result shown in FIG. 4 can be added together first, then multiplied by the scaling factor μ ("mu"). This multiplication produces the update amount that is added to the current coefficient value $C_n(k)$ stored in register 406, to produce the next coefficient value $C_{n+1}(k)$. The process described above is repeated for each coefficient of the ten-tap filter, by sequentially operating each of the ten rows of update logic in circuit 400.

In a parallel implementation of circuit 400, the registers 406 in all of the rows of update logic are updated at the same time with the appropriate C(x) values. The summation result is fed back to all of the ten rows of update logic. As in the case of the sequential implementation, a first intermediate result is produced corresponding to a constraint related to group delay, and the second intermediate result is produced corresponding to a constraint related to a measure of error in the filtered signal. Also, while equation (6) is shown as applying separate scaling factors μ and α to the constraint relating to measured error and the constraint relating to group delay, respectively, a simplification is again made in circuit 400 by assuming that the two scaling factors are equal and can each be represented as μ. However, each row of update logic is operated simultaneously, as opposed to one row at a time. In each row of update logic, the first intermediate result and the second intermediate result can be added together first, then multiplied by the scaling factor μ. This multiplication produces the update amount that is added to the current coefficient value $C_n(k)$ stored in register 406, to produce the next coefficient value $C_{n+1}(k)$. These operations are performed by each of the ten row of update logic in a parallel fashion.

Circuit 400 illustrates a particular implementation for updating filter coefficients in accordance with one embodiment of the present invention. While circuit 400 is directed specifically to a filter having ten taps, as an example, coefficient updates for a filter having a number of taps other than ten can certainly be realized using a circuit similar to circuit 400.

Figure 5:
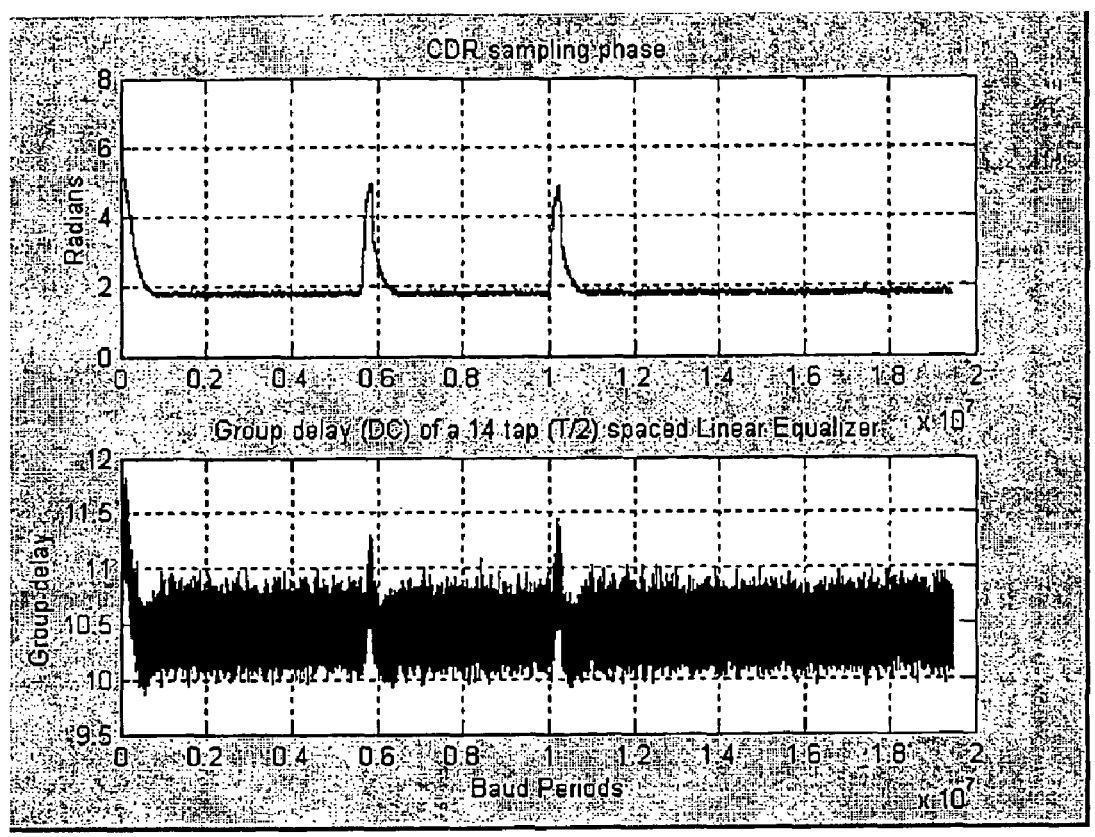
FIG. 5 is a plot of simulated performance results for an adaptive equalizer and associated clock recovery circuit, where no group delay constraint is taken into account in updating of filter coefficients.

FIG. 5 is a plot of simulated performance results for an adaptive equalizer and associated clock recovery circuit, where no group delay constraint is taken into account in updating of filter coefficients. The simulated system is represented by FIG. 3, and the adaptive equalizer utilizes a feed-forward filter that is implemented as a T/2 fractionally spaced linear filter. The upper graph in FIG. 5 shows a plot of the phase of VCO 212 (in radians) versus time (in symbols). The lower graph in FIG. 5 shows a plot of the group delay (in symbols) of feed-forward filter 202, plotted on the same time scale. It can be seen that the phase of VCO 212 experiences rapid variations due to changes in the group delay of feed-forward filter 202. Specifically, as filter coefficients are adjusted without taking into account effects on the resulting group delay, the phase of VCO 212 exhibits noticeable spikes that may be associated with instability of the receiver.

Figure 6:
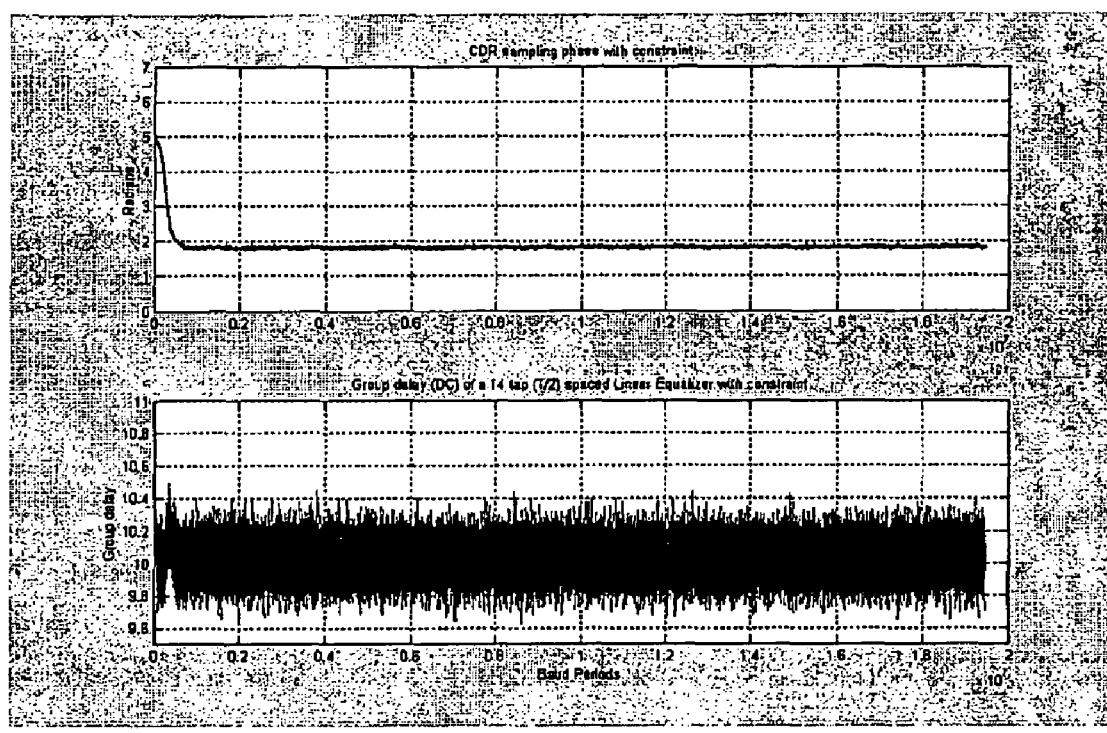
FIG. 6 is a plot of simulated performance results for an adaptive equalizer and associated clock recovery circuit, where a group delay constraint is taken into account in updating of filter coefficients.

FIG. 6 is a plot of simulated performance results for an adaptive equalizer and associated clock recovery circuit, where a group delay constraint is taken into account in updating of filter coefficients. As in FIG. 5, the simulated system is represented by FIG. 3, and the adaptive equalizer utilizes a feed-forward filter that is implemented as a T/2 fractionally spaced linear filter. The upper graph in FIG. 6 shows a plot of the phase of VCO 212 (in radians) versus time (in symbols). The lower graph in FIG. 5 shows a plot of the group delay (in symbols) of feed-forward filter 202, plotted on the same time scale. It can be seen that the phase of VCO 212 remains relatively flat, without significant changes, even as filter coefficients are adjusted. This result is attributed to the fact that the filter coefficients are updated to take into account a group delay constraint to control the resulting group delay associated with the filter. This produces a system that is significantly more stable, as mutual interference between components within the system are greatly reduced.

Figure 7:
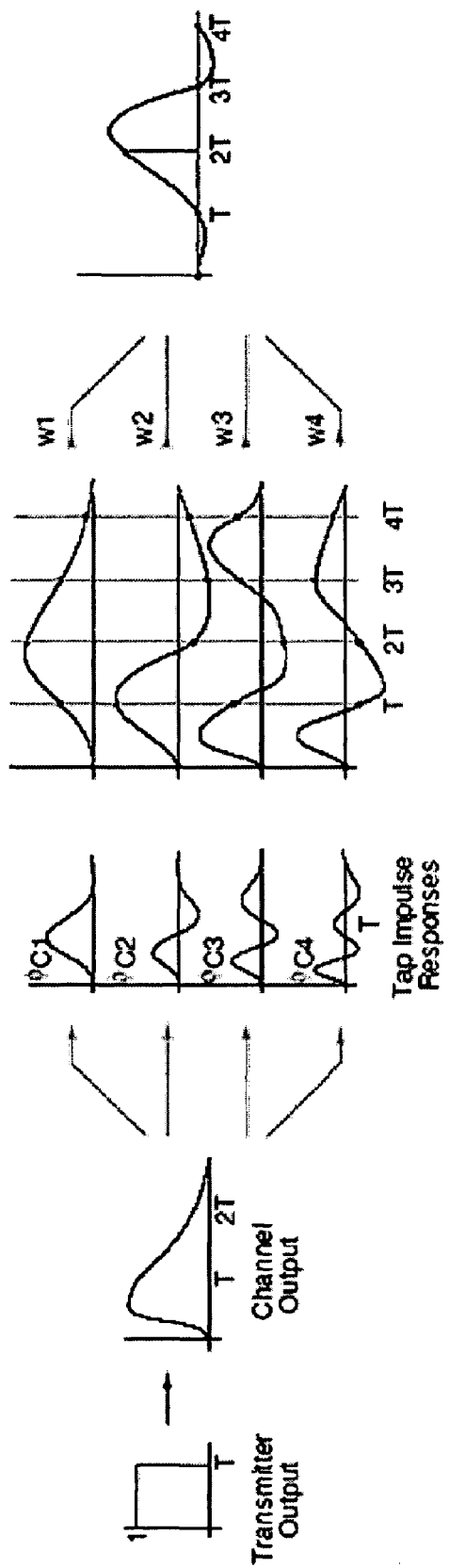
FIG. 7 illustrates equalization performed using a filtering arrangement that may be referred to as a continuous time equalizer (CTE)

FIG. 7 illustrates equalization performed using a filtering arrangement that may be referred to as a continuous time equalizer (CTE), which is described in detail in the following two cross-referenced U.S. patent applications: (1) U.S. patent application Ser. No. 10/872,108, filed Jun. 17, 2004 by Shanthi Pavan for "Power and Area Efficient Adaptive Equalization", and (2) U.S. patent application Ser. No. 10/872,307, filed Jun. 17, 2004 by Shanthi Pavan for "Improved Integrated Circuit Implementation for Power and Area Efficient Adaptive Equalization". As shown, the CTE uses a set of approximately time and frequency limited basis impulse responses {φC1, φC2, φC3, φC4}. It is possible to realize impulse responses {φC1, φC2, φC3, φC4} using low bandwidth components, such as low bandwidth analog circuits. These impulse responses may be continuous-time basis functions that form a linearly independent set, such that a suitable linear combination of the basis impulse responses should be equivalent, after the sampler (not shown), to a four-tap transversal filter with arbitrary weights. While a four-tap filter is represented here, a filter having a different number of taps can certainly be implemented using a similar technique. The CTE may be used, for example, to realize one or more filters within a decision-feedback equalizer (DFE).

Figure 8:
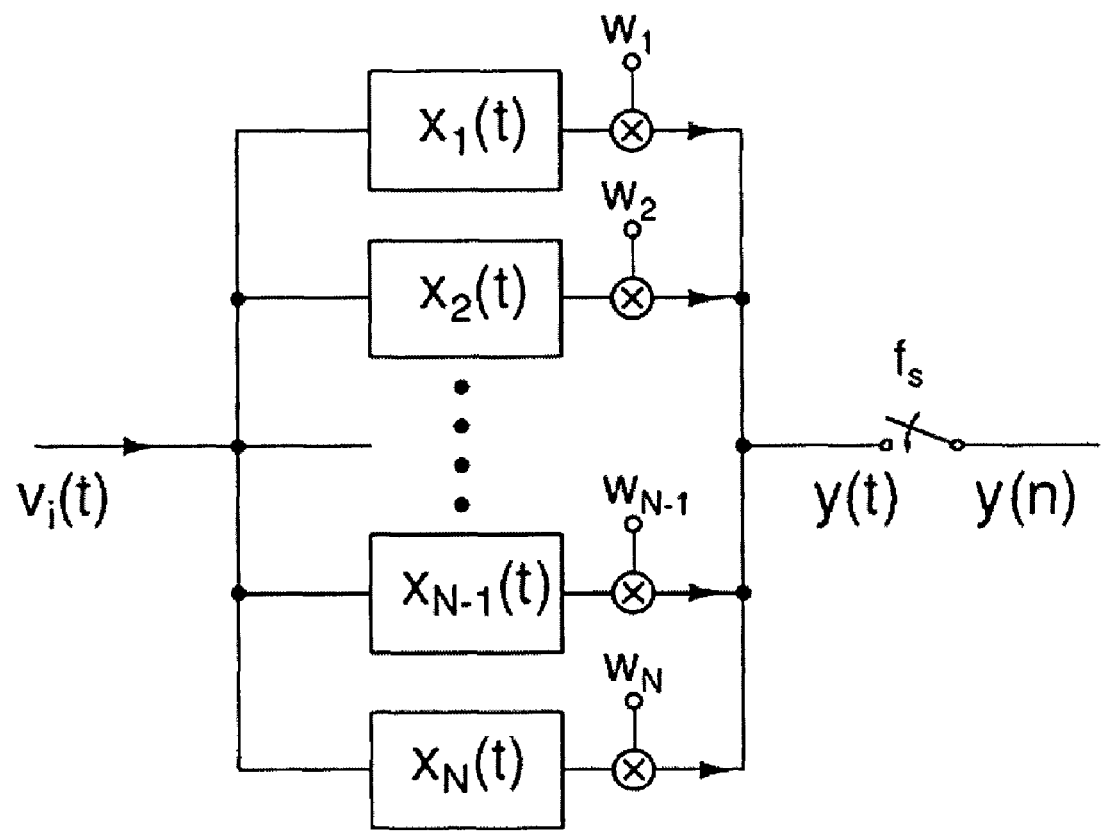
FIG. 8 is a representation of the CTE filtering arrangement shown in FIG. 7.

FIG. 8 is a representation of the CTE filtering arrangement shown in FIG. 7. Thus, the basis functions illustrated in FIG. 7 can be associated with a bank of low bandwidth continuous-time filters. Thus, an equivalent transversal filter can be built using a linear combination of such low bandwidth continuous-time filters. This approach can be extended to a realize a transversal filter with an arbitrary number of taps.

Figure 9:
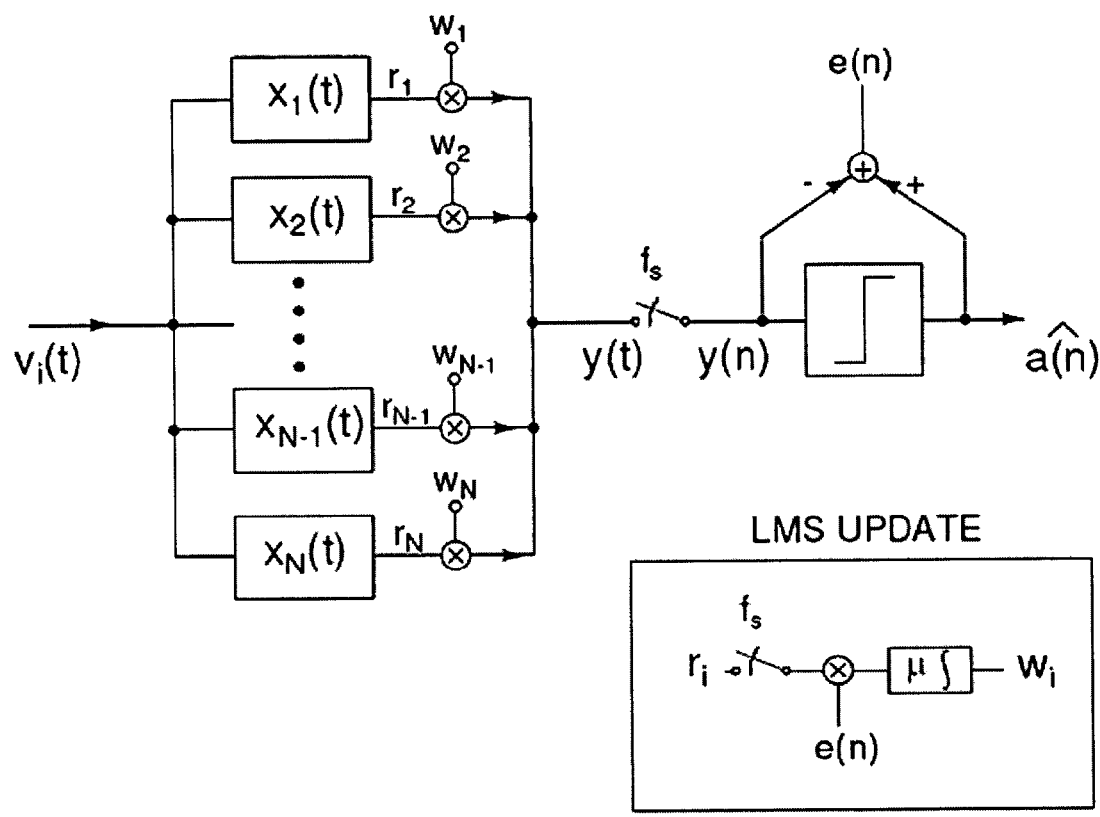
FIG. 9 is a block diagram of a CTE having tap weights that are updated by a decision directed LMS algorithm.

FIG. 9 is a block diagram of a CTE having tap weights that are updated by a decision directed LMS algorithm. The CTE illustrated here may be seen as a linear combiner, which has a unimodal error surface. Hence, an LMS algorithm can be used to drive the tap weight vector in order to achieve a minimum mean square error (MMSE) solution. A decision directed adaptation mode can be used to converge the taps. In this figure, μ represents a scaling factor that controls the speed of adaptation of the filter. As shown in the figure, the "gradients" used by the LMS algorithm are simply the outputs of the individual filters, which are explicitly available. The update equation associate with the updates of the CTE tap weights shown in this figure can be expressed as:

$$W_i(n+1) = W_i(n) + \mu \cdot e(n) \cdot r_i(n) \quad (8)$$

wherein $W_i(n+1)$ represents the updated CTE tap weight for the $i^{th}$ filter in the filter bank; $W_i(n)$ represents the current CTE tap weight for the $i^{th}$ filter in the filter bank; μ represents the scaling factor for controlling the speed of adaptation; $e(n)$ represents a measure of error of the current equalized signal; and $r_i(n)$ represents the output of the $i^{th}$ filter in the filter bank. Here, i ranges from i=1 to i=N for a bank of N filters. In FIG. 9, the CTE tap weights are not explicitly labeled as either current tap weights or updated tap weights. The update operation is simply illustrated in graphical form. In FIG. 9, the current CTE tap weight for the $i^{th}$ filter in the filter bank is labeled as "$W_1$", "$W_2$", . . . , "$W_{N-1}$", and "$W_N$", for i=1 through i=N. Thus, equation (8) outlines the update operation for updating the current CTE tap weights $W_i(n)$ to produce the updated CTE tap weights $W_i(n+1)$. The notation of equation 8 uses the subscript (e.g., "i") to denote tap number, and the term in the parenthesis (e.g., "n+1") to denote time. This is different from the notation of equations 1 through 7, which uses the subscript to denote time and the term in the parenthesis to denote tap number.

According to one embodiment of the present invention, a new update equation for the CTE tap weights may be adopted to take into account a target group delay. The new update equation may be derived as follows.

Let $w_i$ denote the current tap weight, or coefficient, for the $i^{th}$ filter in the CTE filter bank. Thus, the continuous-time impulse response of the CTE filter bank may be expressed as $$y(t) = \sum_{i=1}^{N} w_i x_i(t),$$

and the DC group delay of y(t) may be expressed as:

$$\int_{t=0}^{Timp} t \sum_{i=1}^{N} w_i(n) x_i(t) dt \bigg/ \int_{t=0}^{Timp} \sum_{i=1}^{N} w_i(n) x_i(t) dt$$

where:
N is the number of CTE taps;
Timp is the length (i.e. time span) of the CTE filters; and
$x_i(t)$ is the impulse response of the $i^{th}$ CTE filter.

If we define $$a_i = \frac{1}{T} \int_{t=0}^{Timp} t x_i(t) dt \text{ and } b_i = \frac{1}{T} \int_{t=0}^{Timp} x_i(t) dt$$

then DC group delay of y(t) can be written as $$\sum_{i=1}^{N} w_i(n)a_i \bigg/ \left\{ \sum_{i=1}^{N} w_i(n)b_i \right\}.$$

Accordingly, the current DC group delay error may be expressed as: $e_{gd}(n)=m(n)-\text{groupDelay} \times d(n)$, where $$m(n) = \sum_{k=1}^{N} a_k w_k(n) \text{ and } d(n) = \sum_{k=1}^{N} b_k w_k(n).$$

The LMS update equations for the CTE filter bank may then be altered to includes an additional constraint relating to group delay:

$$\alpha e_{gd}(n)(a_i - \text{groupDelay} \times b_i)$$

where:
i is the index of the CFE tap weight being updated ($1 \leq i \leq N$);
groupDelay is the target group delay ($0 \leq \text{groupDelay} \leq N-1$); and
$\alpha$ is the group delay gain term, or scaling factor, for the new constraint.

Since the CTE impulse responses $x_i(t)$ are known, the weighting factors $a_i$ and $b_i$ can be pre-computed once and stored.

Thus, the new update equation for the CTE tap weights that introduces a new constraint to take into account a target group delay can be expressed as:

$$W_i(n+1) = W_i(n) + \mu \cdot e(n) \cdot r_i(n) - \alpha e_{gd}(n)(a_i - \text{groupDelay} \times b_i) \quad (9)$$

Accordingly, the CTE tap weights are multiplier factors that are adaptively updated to take into account a constraint relating to a measure of error in the equalized version of the received signal and a constraint relating to group delay associated with the CTE filter bank.

An optical receiver system is one type of receiver system in which adaptive equalization that takes into account group delay, as illustrated in various embodiments described above, may be applicable. However, effects of mutual interference between portions of an adaptive equalizer and other circuits may persist in other types of receiver systems. Accordingly, techniques illustrated in various embodiments of the present invention may also be applicable to receiver systems other than optical receiver systems.

While the present invention has been described in terms of specific embodiments, it should be apparent to those skilled in the art that the scope of the present invention is not limited to the described specific embodiments. The specification and drawings are, accordingly, to be regarded in an illustrative rather than a restrictive sense. It will, however, be evident that additions, subtractions, substitutions, and other modifications may be made without departing from the broader spirit and scope of the invention as set forth in the claims.

What is claimed is:

1. A method for performing adaptive equalization comprising:
    receiving a signal originating from a channel associated with inter-symbol interference;
    filtering the received signal using a filter having a plurality of adjustable tap weights to produce a filtered signal;
    recovering a clock signal from the filtered signal; and
    adaptively updating each of the plurality of adjustable tap weights to a new value to reduce effects of inter-symbol interference, where each of the plurality of adjustable tap weights is adaptively updated to reduce a measure of error in the filtered signal and to reduce a squared difference between a group delay associated with filtering the received signal and a target group delay thereby reducing undesired interaction between adaptively updating each of the plurality of adjustable tap weights and recovering the clock signal from the filtered signal.

2. The method of claim 1, wherein adaptively updating each of the plurality of adjustable tap weights comprises scaling the measure of error in the filtered signal by a first scaling factor and scaling the difference between the group delay associated with filtering the received signal and the target group by a second scaling factor.

3. The method of claim 1, wherein the group delay associated with filtering the received signal is a measure of the group delay of filtering the received signal at zero frequency.

4. The method of claim 1, wherein the target group delay is dynamically adjusted.

5. The method of claim 1, wherein adaptively updating each of the plurality of adjustable tap weights comprises utilizing a gradient of the squared difference between the group delay associated with filtering the received signal and the target group delay.

6. An apparatus for performing adaptive equalization comprising:
    a receiver for receiving a signal originating from a communication channel;
    a filter having adjustable tap weights for filtering the received signal to produce a filtered signal;
    a clock recovery circuit configured to produce a clock signal from the filtered signal; and
    a coefficient unit for supplying the adjustable tap weights, where the coefficient unit is configured to update the adjustable tap weights to reduce a measure of error in the filtered signal and to reduce a squared difference between a group delay associated with the filter and a target group delay, and wherein adaptation of the adjustable tap weights by the coefficient unit to reduce squared difference between the group delay associated with the filter and the target group delay group delay associated with the filter reduces undesired interaction between the filter and the clock recovery circuit.

7. The apparatus of claim 6, wherein the group delay associated with the filter is a measure of the group delay of the filter at zero frequency.

8. The apparatus of claim 6, wherein the coefficient unit is further configured to update the adjustable tap weights utilizing a gradient of the squared difference between the group delay associated with filtering the received signal and the target group delay.

9. A method for performing adaptive equalization, comprising:
    receiving a signal from a communication channel;
    filtering the received signal utilizing a filter having adjustable tap weights to produce a filtered signal; and
    adaptively updating the adjustable tap weights to new values, where updating includes adding a first value based on a measure of error in the filtered signal and adding a second value based on a difference between a group delay of the filter and a target group delay, and wherein the second value is a first quantity multiplied by the difference between an index of each adjustable tap weight and the target group delay, the first quantity being a summation of each of the adjustable tap weights multiplied by the difference between an index of the adjustable tap weight and the target group delay.

10. The method of claim 9, wherein the group delay associated with filtering the received signal is a measure of the group delay of the filtering at zero frequency.

11. The method of claim 9, wherein the first value is the measure of error in the filtered signal multiplied by a delayed copy of the received signal and a scale factor.

* * * * *